(12) United States Patent
Jiang et al.

US007268012B2

(10) Patent No.: US 7,268,012 B2
(45) Date of Patent: Sep. 11, 2007

(54) METHODS FOR FABRICATION OF THIN SEMICONDUCTOR ASSEMBLIES INCLUDING REDISTRIBUTION LAYERS AND PACKAGES AND ASSEMBLIES FORMED THEREBY

(75) Inventors: Tongbi Jiang, Boise, ID (US); Li Li, Boise, ID (US); William M. Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 266 days.

(21) Appl. No.: 10/931,678

(22) Filed: Aug. 31, 2004

(65) Prior Publication Data

US 2006/0046350 A1 Mar. 2, 2006

(51) Int. Cl.
*H01L 21/50* (2006.01)
*H01L 21/48* (2006.01)
*H01L 21/44* (2006.01)
*H01L 23/48* (2006.01)
*H01L 23/28* (2006.01)

(52) U.S. Cl. ............... 438/106; 438/107; 438/110; 438/125; 438/126; 257/778; 257/787

(58) Field of Classification Search ........ 438/106–107, 438/110, 114, 125–127; 257/778–781, 787
See application file for complete search history.

(56) References Cited

U.S. PATENT DOCUMENTS 5,091,331 A 2/1992 Delgado et al.
5,476,566 A 12/1995 Cavasin
5,780,354 A 7/1998 Dekker et al.
5,882,532 A 3/1999 Field et al.
5,927,993 A 7/1999 Lesk et al.
5,969,426 A * 10/1999 Baba et al. ............... 257/778
6,013,534 A 1/2000 Mountain
6,235,552 B1 * 5/2001 Kwon et al. ............. 438/106
6,472,294 B2 10/2002 Meuris et al.
6,492,195 B2 12/2002 Nakanishi et al.
6,603,210 B2 * 8/2003 Kishimoto et al. ........ 257/781
6,784,547 B2 * 8/2004 Pepe et al. ............... 257/758

* cited by examiner

*Primary Examiner*—Luan Thai
(74) *Attorney, Agent, or Firm*—TraskBritt

(57) ABSTRACT

Methods for creating redistribution layers for only selected dice, such as known good dice, to form relatively thin semiconductor component assemblies and packages, and the assemblies and packages created by the methods, are disclosed. A sacrificial layer is deposited on a support substrate. An etch stop layer having a lower etch is deposited on the sacrificial layer. Redistribution lines in a dielectric material are formed on the support substrate on the etch stop layer. Semiconductor dice, either singulated or at the wafer level, are connected to the redistribution lines. The assembly may be scribed to allow the sacrificial layer to be etched to enable removal of the semiconductor dice and associated redistribution layer from the support substrate. The etch stop layer is removed to allow access to the redistribution lines for conductive bumping.

43 Claims, 6 Drawing Sheets

METHODS FOR FABRICATION OF THIN SEMICONDUCTOR ASSEMBLIES INCLUDING REDISTRIBUTION LAYERS AND PACKAGES AND ASSEMBLIES FORMED THEREBY

BACKGROUND OF THE INVENTION

1. Field of the Invention

The present invention relates generally to the field of integrated circuits including redistribution layer lines or traces and other interconnect structures and, more particularly, although not necessarily limited to, low profile, packaged integrated circuits including a redistribution layer comprising one or more levels of lines, and methods for their fabrication.

2. State of the Art

In order to function, integrated circuits must be in electrical communication with signal inputs and outputs as well as power and ground or bias connections external to the integrated circuit. For example, power and ground or other reference voltage must be supplied for operation of the integrated circuit, and other connections, such as for input, output and timing signals, may also be required. These connections are typically made through leads or other conductive elements connected to bond pads present on the active surface of a semiconductor die incorporating the integrated circuit.

As electronic devices have become smaller and more sophisticated, the challenge of expanding capabilities while minimizing the space, or "real estate," also termed the "footprint," used by an integrated circuit has continued to increase. Techniques for reducing the space used by a semiconductor package include the use of a redistribution layer (RDL) as an additional level of wiring to reposition input and output (I/O) contact locations from the perimeter or center of the active surface to alternative locations. This redistribution process may be necessary if perimeter or central bond pads have to be rerouted into another I/O layout. For example, if the perimeter pad pitch is too fine or does not match the terminal pad layout of a substrate on which the semiconductor die is to be mounted, repositioning may be required. One common example of a redistribution approach is to redistribute a central bond pad layout into a two-dimension array over the active surface of the semiconductor die, the redistributed contact locations then being topped with discrete conductive elements such as solder balls to form a so-called ball grid array.

In a conventional redistribution structure, redistribution layer lines or traces may be embedded into a dielectric material on a surface of a semiconductor die. Typically, the lines or traces are formed on a dielectric layer, and another dielectric layer is then formed over the lines or traces, the ends of the lines or traces at the redistributed contact locations remaining exposed for subsequent disposition or formation of discrete conductive elements thereon. Suitable dielectric materials may include BCB, polyimide, or photosensitive dielectrics. The process employed depends on whether the redistribution lines or traces are formed of aluminum or copper. For aluminum or copper traces, the metal may be sputtered onto the wafer and the traces etched using a photolithography-defined etch mask. In case of copper traces, the metal may be electroplated and then similarly etched to form traces. A layer of dielectric material may then be deposited over and around the traces and apertures formed therethrough to expose the new contact locations. In another approach, commonly termed a damascene process, the lines or traces may be deposited into recesses formed in a dielectric layer. In yet another approach, preformed lines or traces carried on a dielectric film may be applied to the surface of the semiconductor chip. Redistribution lines or traces are typically employed on the active surface of a semiconductor die to enable so-called "flip-chip" mounting of the semiconductor die with its active surface facing the carrier substrate.

For ease of processing, RDLs are conventionally formed simultaneously on a large plurality of semiconductor dice at the wafer level, over the entire surface of a semiconductor wafer. The RDL process is thus performed for every potential semiconductor die in a wafer, including those that may have manufacturing defects and are inoperable or fail to meet desired specifications. Significant materials can thus be wasted in processing useless dice. Further, in order to allow the wafer to undergo the processing needed to form the RDLs, the wafer must be of sufficient thickness to be handled by processing equipment without the risk of damage to the physical structure or integrated circuitry of the wafer. This requirement limits the amount of thinning that can be done to the wafer prior to forming the RDLs. Once RDL formation is completed, thinning the wafer is then constrained by the need to protect the wafer surface from etchants used in chemical thinning, the stress to which the wafer may be subjected without damage during mechanical thinning, known as "back grinding," or debris created by use of a mechanical thinning process.

Accordingly, a method or system that would be able to effectively form RDLs for semiconductor packages using only semiconductor dice that have been qualified as known good dice (KGD) would be an improvement in the art. Such a technique would enable the fabrication of thin, or low profile, semiconductor packages providing an improvement in the art.

BRIEF SUMMARY OF THE INVENTION

The present invention includes, in a number of embodiments, methods for creating redistribution layers that may be employed only with selected semiconductor dice (such as dice that have been tested and characterized as known good dice) and that result in a low profile semiconductor component assembly or package.

In one embodiment of the present invention, a sacrificial layer is deposited on a support substrate. An etch stop layer having a lower etch rate than the sacrificial layer is deposited over the sacrificial layer. Redistribution lines or traces may then be formed on the support substrate atop the etch stop layer. Semiconductor dice configured for flip-chip attachment by disposition of discrete conductive elements on the active surface thereof may then be mechanically and electrically connected to the redistribution lines or traces and the resulting assembly may be underfilled, encased in a dielectric molding compound, or both.

In one aspect of the method of the present invention, the resulting assembly may then be scribed from the top to expose the sacrificial layer and allow it to be etched to separate or singulate each semiconductor die and its associated redistribution layer from one another and to facilitate removal of the singulated assemblies from the support substrate. Scribing from the top of the assembly and around the semiconductor die peripheries, followed by etching of the sacrificial layer, enables reuse of the support substrate.

In another aspect of the method of the present invention, the support substrate may be scribed through from below to enable multi-die assemblies mechanically connected by the sacrificial and etch stop layers and, optionally, electrically connected by suitably configured traces of associated redistribution layers, to be removed from the support substrate as multi-die modules. The sacrificial layer may then be removed by etching and the etch stop layer removed to enable mechanical and electrical access to the redistribution lines from the bottom of the assemblies, so that all of the semiconductor dice may have conductive bumps substantially concurrently applied to the redistribution layer at the wafer level, followed by singulation of semiconductor component packages including one or more dice.

With either of the foregoing approaches, the semiconductor dice employed may be thinned to an extreme degree, since the structure of the semiconductor dice is not load bearing or otherwise stressed. In one approach to thinning, the semiconductor dice may be thinned while still part of their wafer of origin, for example prior to a wafer-level burn-in to qualify selected dice as known good dice. The qualified dice may then be picked from the wafer after singulation, as known in the art, and placed at appropriate locations on the redistribution layer carried by the support substrate. In another approach to thinning, the semiconductor dice are only partially, or not at all, thinned at the wafer level and, when subsequently singulated, are placed on the redistribution layer in a form at or close to the original wafer thickness. The array of semiconductor dice secured to the support substrate via the redistribution layer are then thinned in place, resulting in very precise planarity, good surface finish, low thickness variation, and ease of process as well as low cost.

In a further embodiment of the invention, a wafer of unsingulated, flip-chip configured semiconductor dice may be aligned with, and mechanically and electrically connected to, a wafer level redistribution layer carried on a support substrate, as previously described. The resulting wafer level assembly may then be scribed from the top, singulating the semiconductor dice or groups of dice at the same time the redistribution layer and underlying etch stop layer are scribed through. Alternatively, when scribing from the bottom of the wafer level assembly, the unsingulated redistribution layer with attached unsingulated wafer bearing the semiconductor dice may be removed, conductive bumps applied, and the assembly subsequently segmented into semiconductor component packages.

In other embodiments, semiconductor component assemblies and packages fabricated in accordance with the methods of the present invention are also encompassed by the present invention.

BRIEF DESCRIPTION OF THE DRAWINGS

In the drawings, which, in conjunction with the accompanying text, disclose the best mode presently known to the inventors for carrying out the present invention.

DETAILED DESCRIPTION OF THE ILLUSTRATED EMBODIMENTS

The present invention comprises methods for creating semiconductor packages employing redistribution layers including only selected dice, such as known good dice, and forming a thinner final semiconductor component assembly than is possible with conventional techniques, as well as the semiconductor component packages and substrates created by the inventive methods. The embodiments herein described, while illustrating certain specific and exemplary implementations of the present invention, are not intended to limit the invention or the scope of the appended claims. Those of ordinary skill in the art will also understand that various combinations or modifications of the disclosed, exemplary embodiments and individual features and elements thereof may be made without departing from the scope of the invention.

Figure 1:
FIG. 1 is a side view of a portion of a support substrate useful in practicing methods in accordance with the present invention.

Turning to FIG. 1, there is depicted a support substrate 10. Support substrate 10 may comprise any material capable of supporting additional layers. For example, a substrate comprising silicon, as formed in the art by growing a single crystal wafer in the form of a cylinder, which is then segmented or sliced, such as a wafer, may be used. Alternatively, another bulk semiconductor substrate may be employed, such as a silicon-on-sapphire (SOS) substrate, or a silicon-on-glass (SOG) substrate, or other type of silicon-on-insulator (SOI) substrate. Other substrates that are suitable for supporting additional layers and semiconductor dice thereon, such as BT resin, FR-4 and FR-5 laminates, ceramic substrates, metallic plates or polymeric materials formed into a substrate having a substantially planar upper surface may be used. In order to enable handling and processing with conventional equipment, the support substrate 10 may be a semiconductor wafer or may be of another material and sized as a conventional semiconductor wafer. However, the support substrate 10 may, as desired, have any suitable shape, as long as a substantially planar upper surface 11 is provided. The support substrate 10 may thus be formed as a planar disk or a planar polygonal substrate, all such structures falling within the scope of the present invention.

Figure 2:
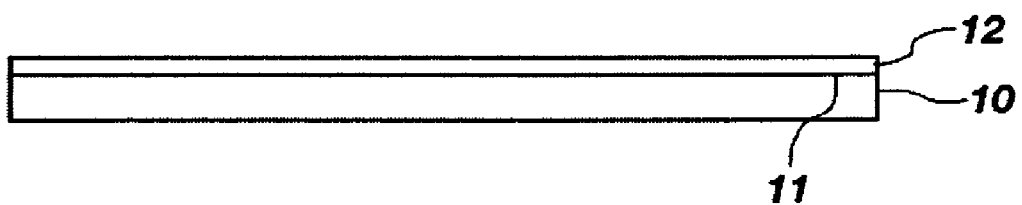
FIG. 2 is a side view of the portion of the support substrate of FIG. 1, including a layer of sacrificial material applied thereto.

FIG. 2 shows the support substrate 10 of FIG. 1 with a sacrificial layer 12 disposed on the planar upper surface 11 thereof. Sacrificial layer 12 may comprise any suitable material selected for its suitability for etching with a suitable etchant in practicing the methods of the present invention, as will be explained in further detail herein. For example, a flowable silicon oxide (SiOx) material, such as silicon dioxide, may be deposited by CVD at a temperature of about 125° C. to a thickness of from about 500 Å to about 5000 Å for use as a sacrificial layer 12, where an acidic etchant, such as an HF solution, is to be used. Similarly, an aluminum sacrificial layer may be used where the etchant is $H_2SO_4$ and $H_2O_2$ in aqueous solution. Other suitable sacrificial layer materials include, for example, borophosphosilicate glass (BPSG) and TEOS, in association with suitable etch stop materials. Sacrificial layer 12 may be deposited on the support substrate 10 in any suitable fashion, including chemical vapor deposition (CVD), physical vapor deposition (PVD, also known as sputtering) flowing, spin coating, or in any other manner suitable for the selected material.

Figure 3:
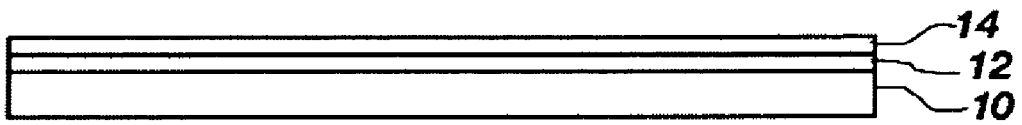
FIG. 3 is a side view of the portion of the support substrate of FIG. 2, including a layer of etch stop material applied thereto over the layer of sacrificial material.

Turning to FIG. 3, an etch stop layer 14 is depicted deposited on sacrificial layer 12. Etch stop layer 14 may be any suitable material that has a significantly slower etch rate in comparison to the etch rate exhibited by the sacrificial layer 12 to the selected etchant. For example, an etch stop layer 14 of TEOS of about 100 Å in thickness may be used as an etch stop with either of the exemplary materials for sacrificial layer 12 and associated etchant combinations discussed in the preceding paragraph. Of course, other materials including polyimides and other polymeric materials may be suitable for use in forming the etch stop layer 14, and all such materials are within the scope of the present invention. Similarly, the etch stop layer 14 may be deposited upon the sacrificial layer using any method suitable for the etch stop material selected, such as flowing, spin coating, CVD, sputtering, or as otherwise known to those of ordinary skill in the art.

Figure 4:
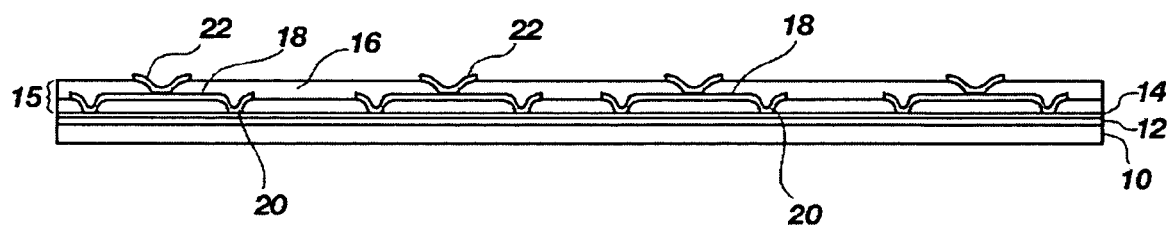
FIG. 4 is a side cross-sectional view of a support substrate having the structure of FIG. 3 after further processing, depicting a plurality of redistribution layers formed thereon in accordance with the present invention.

Redistribution layer 15, including a plurality of conductive lines or traces 18 for rerouting contact locations of semiconductor dice to be mounted on support substrate 10, may then be formed on the etch stop layer 14, as shown in FIG. 4. Redistribution layer comprises a dielectric material 16, such as BCB, a polyimide, TEOS, silicon nitride, a photosensitive dielectric, phosphosilicate glass (PSG), borosilicate glass (BSG), borophosphosilicate glass (BPSG) or any other suitable dielectric or passivating material containing one or more levels of embedded electrically conductive lines or traces 18. Dielectric material 16 may be applied to the surface of etch stop layer 14 by, for example, spin coating, CVD, PECVD or any other suitable method, depending on the selected material.

The conductive lines or traces 18 may comprise a metallic material, such as gold, copper, aluminum or alloys thereof, although it will be appreciated that other conductive materials, such as other metals, or conductive polymeric materials, such as conductive epoxies, may be used. The conductive lines or traces 18 may be formed as a blanket layer of conductive material deposited on an underlying layer of dielectric material 16, the blanket layer being masked, photolithographically patterned and etched to define conductive lines or traces 18 prior to deposition of an overlying layer of dielectric material 16. For example, aluminum or copper may be deposited by physical vapor deposition (sputtering). Copper may be electroplated or electrolessly plated. It is also contemplated that deposited nanoparticles may be used for trace formation, using atomic layer deposition (ALD) techniques. It is further contemplated that metallic organic chemical vapor deposition (MOCVD) techniques may be used to deposit, for example, aluminum, tungsten, copper or gold.

In another approach and as desired, a polymer or other dielectric layer may be applied to etch stop layer 14 and trenches in the form of trace patterns etched therein or, if a photosensitive polymer is employed, the trenched trace patterns may be formed therein by appropriate masking and patterning of a photoresist followed by exposure to a selected wavelength or wavelength range of light (for example, UV) to effect a cure of the exposed portions of the photopolymer. Alternatively, a UV laser beam may be traversed across the photopolymer in a controlled manner to "write" the recesses wherein traces may be placed by curing the surrounding portions of the photopolymer. If a photopolymer is employed, a blanket layer may be applied and cured to form a dielectric bottom for the trenches to be formed for receipt of conductive material. After the trenches are formed, the traces may be formed by conventional damascene processing comprising blanket deposition of a conductive material followed by planarization of the structure to remove the conductive material in excess of that in the trenches. Fabrication of redistribution layer 15 may be simplified by using a single material, for example, a polyimide, for both the etch stop layer 14 and dielectric material 16.

After conductive lines or traces 18 are formed, another layer of dielectric material 16, which may comprise the same or a different material as that of the dielectric material 16 underlying the conductive lines or traces 18, may be deposited over lines or traces 18. Subsequent to such deposition, apertures may be etched or otherwise defined (as by patterning of a photopolymer) to expose portions of conductive lines or traces for connection to semiconductor dice to be mounted to support substrate 10. Notably, additional metallization may be formed in the apertures in contact with the conductive lines or traces in the form of single or multiple layers to form conductive vias, enlarged conductive pads (such as terminal pads 22) on the surface of the upper layer of dielectric material, or both, as known in the art.

While shown as a single level of laterally extending conductive lines or traces 18, redistribution lines or traces 18 may comprise one or more levels, as may be required for a specific application, including the final intended use of the semiconductor packages. For example, as known in the art, conductive vias may be formed to connect, and in combination with multiple levels of lines or traces 18 using conventional techniques such as dual damascene processing. Similarly, conductive vias may be so formed below the lowermost (or a single) level of conductive lines or traces 18 to extend to etch stop layer 14. Thus, conductive lines or traces 18 may include terminal pads 20 formed in apertures in the underlying portion of the dielectric layer on which the conductive lines or traces 18 are formed, immediately adjacent the etch stop layer 14 for subsequent connection of the resulting semiconductor component packages to external circuitry. Similarly and as noted above, terminal pads 22 may be formed in apertures in an overlying layer of dielectric material 16 above and in combination with conductive lines or traces 18 in contact therewith at the upper level of the redistribution layer 15 for connecting to semiconductor dice 30 (FIG. 5).

Figure 5:
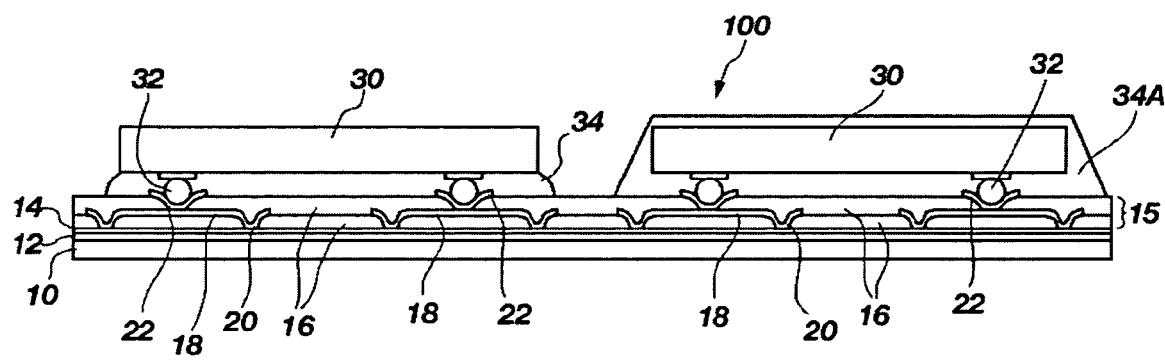
FIG. 5 is a side cross-sectional view of a wafer level assembly comprising the support substrate of FIG. 4 with semiconductor dice attached to the plurality of redistribution layers.

At least one semiconductor die 30 may be connected to the conductive lines or traces 18 by placing discrete conductive elements 32, such as solder balls, other metal or alloy balls, metal coated polymer balls, bumps or studs, or bumps or pillars of conductive or conductor-filled epoxy (or, alternatively, a layer of an anisotropic (Z-axis) conductive adhesive) in mechanical and electrical contact with the terminal pads 22, as depicted in FIG. 5, to form a wafer level assembly 100. As depicted, this may be accomplished by the attachment of the die 30 to the substrate in a flip-chip manner with discrete conductive elements 32 disposed on a like pattern of terminal pads 22. If solder balls are employed, a conventional reflow process may be employed to effect the connection, whereas if a conductive or conductor-filled epoxy is employed, a heat-induced cure may be effected by placing the assembly in an oven. A so-called "B" stage epoxy may be employed to effect a tacky adhesion of the semiconductor dice 30 to redistribution layer 15 prior to a complete cure of the epoxy.

The mechanical and electrical connection between each semiconductor die 30 and conductive lines or traces 18 may then be encapsulated for protection. Encapsulation may be accomplished by flowing a dielectric underfill material 34 into the space or standoff between each semiconductor die 30 and the redistribution layer on support substrate 10. Suitable underfill materials may include epoxies, polymers and other suitable nonconductive materials that may be flowed into and around an array of discrete conductive elements 32 to provide a more robust mechanical connection between each semiconductor die 30 and redistribution layer 15 and protect the connection effected by discrete conductive elements 32. Of course, if an anisotropic conductive layer is employed, use of an underfill is unnecessary.

In some embodiments, the entire semiconductor die 30 may be encapsulated in a molding compound 34A, rather than merely disposing an underfill material 34 below the dice. Of course, an underfill material 34 may first be disposed between a semiconductor die 30 and redistribution layer 15 prior to encapsulation of the sides and back side of the die. Encapsulation of a semiconductor die 30 may be effected by any suitable method, such as by screen printing molding compound 34A over the semiconductor die 30 or by dipping the attached semiconductor dice 30 into a molding compound 34A. Molding compound 34A may be formulated to be cured by photo activation (initiation of cross-linking), heat curing, a combination of the two or as otherwise suitable for the selected molding compound 34A. Examples of suitable underfill and encapsulant materials for use in molding include XKE7817 available from Toshiba; other suitable materials are available from Nitto Denko, Shin-Etsu, Sumitomo and Cookson. An example of a suitable material for use in screen printing an underfill or encapsulant material is the Ablestik RP658-5B available from Ablestik Laboratories of Rancho Dominguez, Calif.; other suitable materials are available from Dexter, Hitachi, Toshiba, Nagase, 3M and Sumitomo. It will be appreciated that the underfill and encapsulant materials identified herein are merely exemplary and any suitable materials known to those of ordinary skill in the art may be used.

Figure 6:
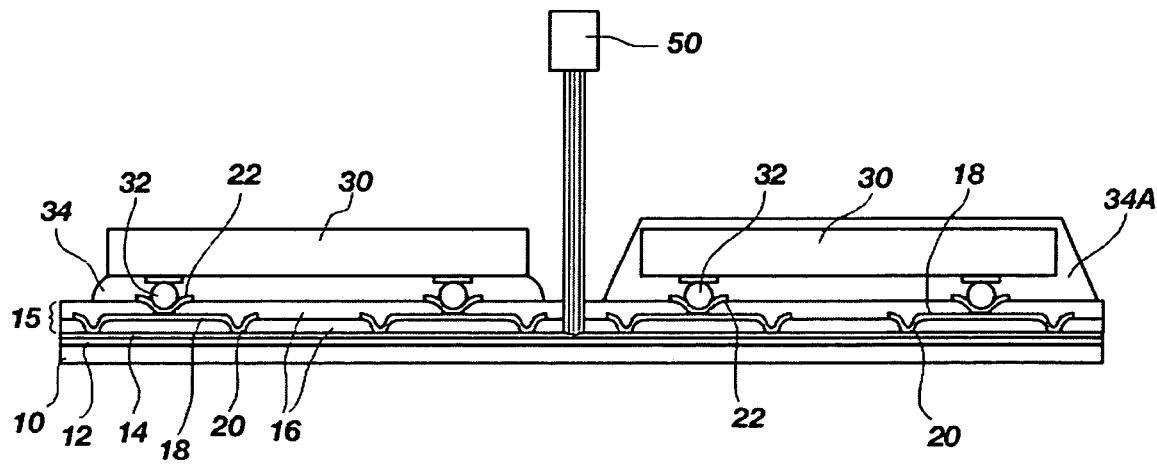
FIG. 6 is a side cross-sectional view of the support substrate of FIG. 5 in the process of scribing of the sacrificial layer in accordance with one aspect of the present invention.

Turning to FIG. 6, the wafer level assembly 100 of FIG. 5 is depicted undergoing a scribing operation of one aspect of the invention. From the top, or above the wafer level assembly 100, a scribe cut is made between the semiconductor dice 30 through the redistribution layer 15 and etch stop layer 14 to expose the sacrificial layer 12. As used herein, the terms "top" or "above" are used relative to the wafer level assembly, and not with regard to any specific orientation thereof. The scribe cut may pass partially through the sacrificial layer 12, but the depth of the scribe may be controlled so as to not contact and damage the support substrate 10. The material of sacrificial layer 12 thus becomes exposed through the scribe cut. The scribe cut may be effected around the periphery of each semiconductor die 30 of a wafer level assembly 100 to result in a number of singulated semiconductor component assemblies each including a semiconductor die 30, or may be around selected semiconductor dice 30 along other selected scribe lines to result in semiconductor component assemblies containing more that one semiconductor die 30.

As depicted in FIG. 6, the scribe operation may be performed with a cutting laser 50 using ablation of a laser beam. Laser ablation may be effected using any suitable equipment, such as the Model 5000-series lasers, offered currently by ElectroScientific Industries (ESI) of Portland, Oreg. One specific, suitable piece of equipment is a 355 nm wavelength UV YAG laser, ESI Model 2700, which may be used to form scribes as little as 25 µm in width. One hundred pulses using this laser will form a 750 µm deep aperture through silicon. Another suitable laser is the Model 200, offered by Xsil Limited of Dublin, Ireland. Alternatively, the scribing may be performed by an abrasive cutting wheel, a diamond bearing dicing saw, or by etching through redistribution layer 15 and etch stop layer 14 with one or more suitable anisotropic etchants after the scribe lines have been defined with a photoresist mask.

Once the sacrificial layer 12 is exposed by the scribe lines, a suitable etchant may be provided to the sacrificial layer 12 to lift off, or remove, same. For example, where the sacrificial layer is a silicon dioxide material, an acidic etchant, such as an HF solution at a 20:1 dilution may be used and the sacrificial layer removed in about 10 seconds. Similarly, where the sacrificial layer 12 is aluminum, $H_2SO_4$ and $H_2O_2$ in aqueous, deionized (DI) water solution may be employed. Other etchants may be selected based on the composition of the sacrificial layer 12 and etch stop layer 14.

Figure 7:
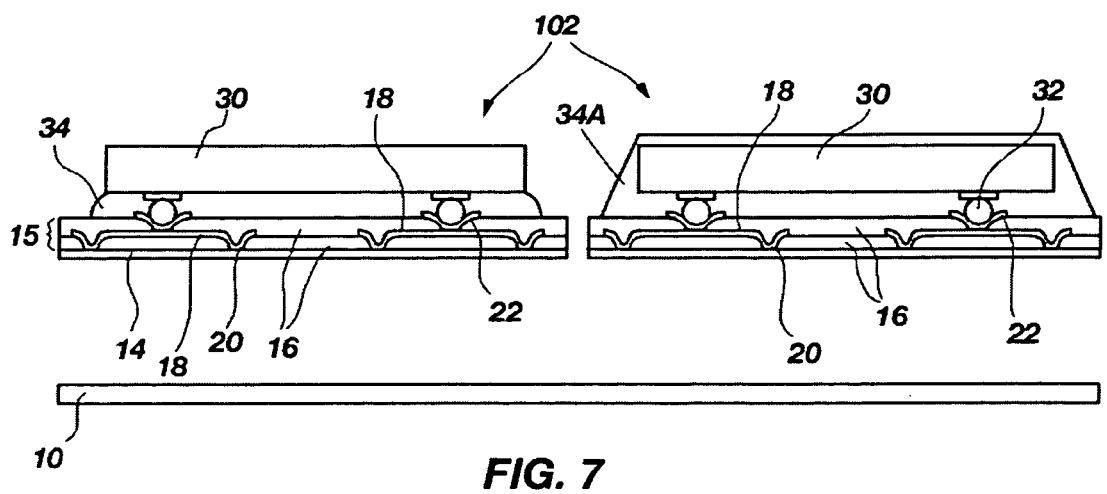
FIG. 7 is a side cross-sectional view of separated or singulated semiconductor packages resulting from scribing of the support substrate.

Sacrificial layer 12 may be etched away by the etchant, which may be provided in a fluid (liquid or gaseous) form. A wet etchant desirably wicks along the sacrificial layer 12 as it etches it. In order to prevent damage to exposed sides of integrated circuitry of semiconductor dice by etchant running down the sides thereof, a spin etch may be used. The singulated or otherwise segregated semiconductor dice 30 with attached redistribution layers 15 may thus be easily removed from the support substrate 10, resulting in the individual semiconductor component packages 102, as depicted in FIG. 7. The support substrate 10, which remains undamaged by the scribing and etching processes, may then be cleaned and reused. Notably, since the etch stop layer 14 extends over terminal pads 20, they remain undamaged by the etchant.

Figure 8:
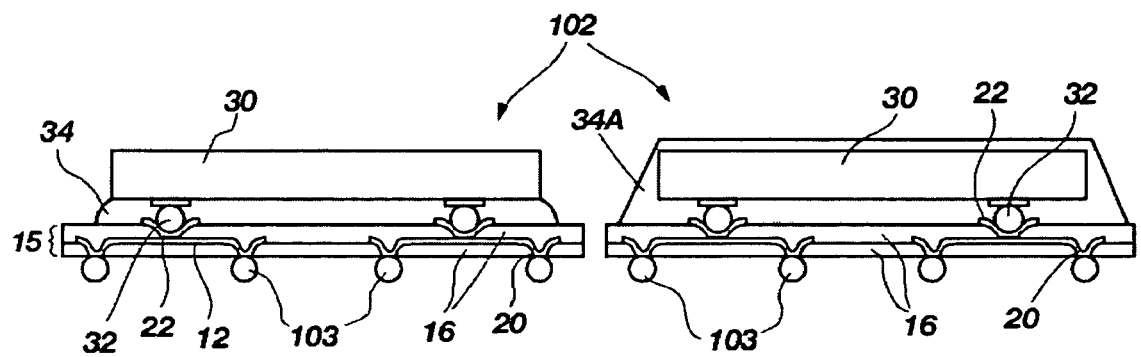
FIG. 8 is a side cross-sectional view of the resulting semiconductor packages of FIG. 7, readied for attachment to a carrier substrate in a flip-chip fashion.

The etch stop layer 14 may then be removed from the bottom of the redistribution layer 15 to expose the terminal pads 20. Removal of the etch stop layer 14 may be performed over the entire lower surface of the resulting package 102, or only at selected locations, such as those of the terminal pads 20 (or other under bump metallization previously fabricated). Removal may be performed by stripping the etch stop layer 14 with a plasma treatment, etching the etch stop layer 14 with a suitable selected etchant, physical removal as by abrasive techniques, such as chemical mechanical polishing, or as otherwise known to those of ordinary skill in the art. Discrete conductive elements 103 in the form of solder balls, other metal or alloy balls, metal coated polymer balls, bumps or studs, or bumps or pillars of conductive or conductor-filled epoxy may be disposed or formed on the terminal pads 20 (or on other suitable under bump metallization previously fabricated) as depicted in FIG. 8, enabling mounting of the resulting semiconductor component packages 102 on a carrier substrate. The resulting semiconductor component packages 102 may thus be formed, if desired, using only semiconductor dice 30 that have been qualified as known good dice and the overall thickness of the semiconductor component packages 102 may be reduced in comparison to packages where the redistribution layers are formed directly on a surface of the semiconductor die, as the semiconductor dice 30 employed in the present invention may be thinned by conventional chemical (etching), mechanical (abrasion) or chemical/mechanical (chemically assisted abrasion in the form of chemical/mechanical polishing) techniques to a thickness of less than about 10 µm prior to application to the redistribution layer 15, as the required thickness and structural support for handling and further processing is provided by the support substrate 10, which is then removed. Thinning of semiconductor dice 30 may be performed by so-called "back grinding" (such term including both mechanical and chemical thinning techniques) at the wafer level before the semiconductor dice 30 are applied to the redistribution layer 15. However, it may also be desirable to singulate semiconductor dice 30 from their wafer of origin without any, or only partial, prior reduction in thickness to provide a more robust structure for testing, handling and a pick-and-place operation to place the semiconductor dice on redistribution layer 15 carried by support substrate 10. If the latter approach is taken, then all of the flip-chip attached semiconductor dice secured to support substrate 10 may then be thinned while supported thereon.

Figure 9:
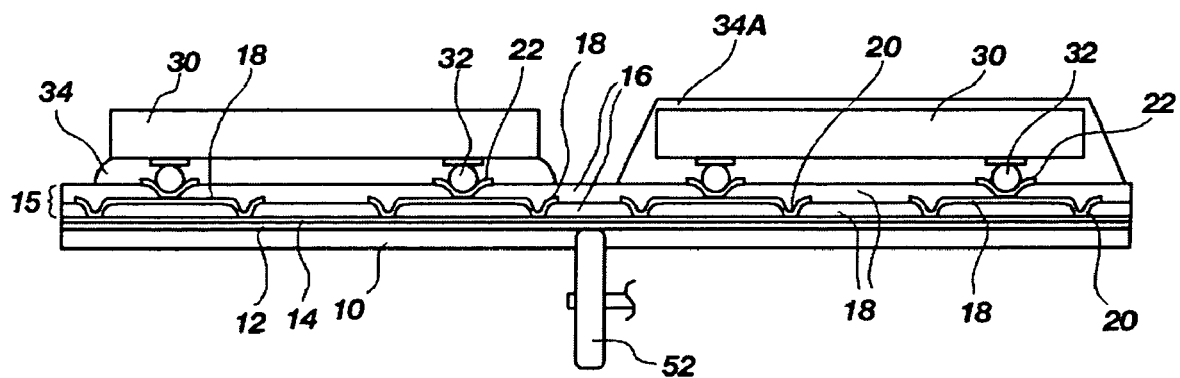
FIG. 9 is a side cross-sectional view of the semiconductor substrate of FIG. 5, in the process of scribing of the support substrate in accordance with another aspect of the present invention.
Figure 10:
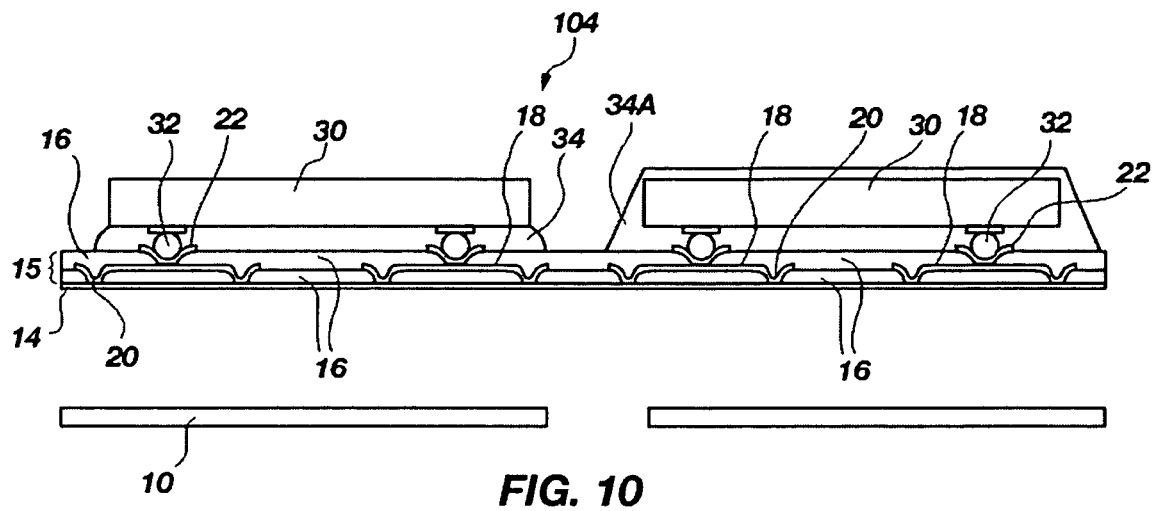
FIG. 10 is a side cross-sectional view of a plurality of mutually attached semiconductor packages resulting from scribing of the support substrate.
Figure 11:
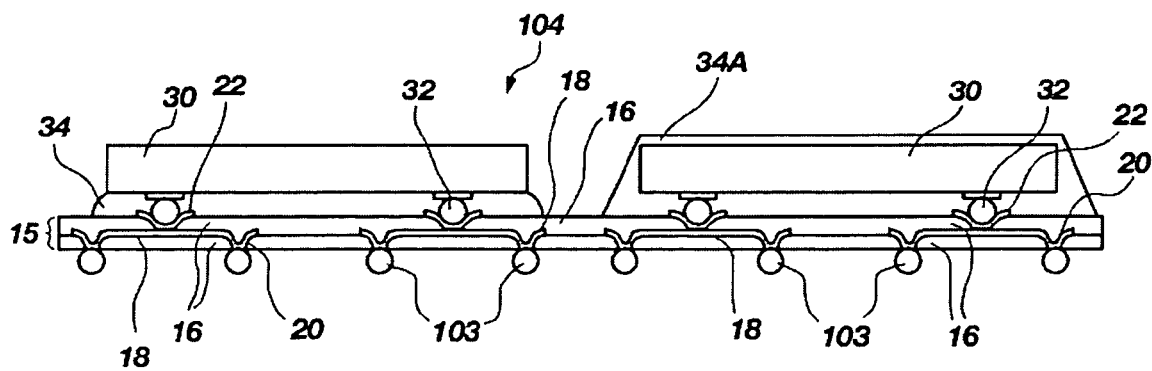
FIG. 11 is a side cross-sectional view of the mutually attached semiconductor packages of FIG. 10, readied for attachment to a carrier substrate in a flip-chip fashion.

Turning to FIGS. 9, 10 and 11, a second aspect of the method of the present invention that may be employed for separating the support substrate 10 from the redistribution layer 15 is depicted. As depicted in FIG. 9, the wafer level assembly 100 of FIG. 5 is depicted undergoing a scribing operation, wherein support substrate 10 is scribed completely therethrough from below to expose the sacrificial layer 12. As used herein, the term "below" is one of relative orientation with respect to the wafer level assembly 100 and without reference to gravity. Thus, the wafer level assembly 100 may be inverted and scribed. The scribe cut may be of sufficient depth to pass partially through the sacrificial layer 12 but not contact the etch stop layer 14. Sacrificial layer 12 thus becomes exposed through the scribe cut through the support substrate 10.

As depicted in FIG. 9, the scribe operation may be performed with an abrasive cutting wheel 52. It will be appreciated that the scribing operation may be conducted by laser ablation, by using a dicing saw, or by masking and etching, as has been described previously herein.

Sacrificial layer 12 may then be etched away by the etchant, which may be provided in a fluid (liquid or gaseous) form. As described previously, a wet etchant may be used so as to wick along the sacrificial layer 12 as it etches. The semiconductor dice 30, with attached, unsevered redistribution layer 15, may thus be removed from the support substrate 10, resulting in a multi-die semiconductor package structure 104, depicted in FIG. 10. The multi-die semiconductor package structure 104 may be treated to remove all or selected portions of the etch stop layer 14, as discussed previously herein. The multi-die semiconductor package structure 104 may thus comprise a low profile, multichip module (MCM) with discrete conductive elements 103 attached to the terminal pads 20 thereof for mounting on a carrier substrate, as depicted in FIG. 11. Notably, scribing from below, while sacrificing the support substrate, enables a rapid, economical wafer level attach of discrete conductive elements 103. Following the wafer level attach of discrete conductive elements 103, individual semiconductor component packages 102, each including a single semiconductor die 30, may be singulated, or groups (four, six, eight, etc.) of semiconductor dice interconnected by conductive lines or traces 18 of redistribution layer 15 may be severed to form MCMs. Of course, it is not required that grouped semiconductor dice 30 be interconnected through redistribution layer 15, as such interconnection may be effected through circuitry on a carrier substrate to which the grouped semiconductor dice are mounted.

Figure 12:
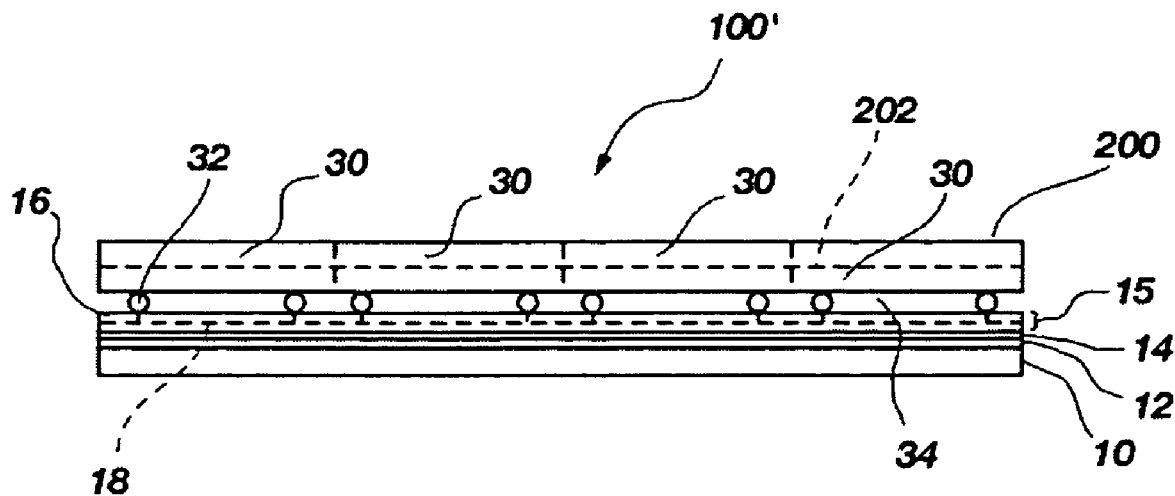
FIG. 12 is a schematic side view of another embodiment of a wafer level assembly according to the present invention employing a wafer bearing a plurality of unsingulated semiconductor dice and FIG. 12A is a schematic side view of a semiconductor component package fabricated therefrom.

As schematically depicted in FIG. 12, the present invention may also be effected using an unsingulated wafer 200 bearing a plurality of semiconductor dice 30 aligned with and secured to a redistribution layer 15 residing on a support substrate 10 carrying a sacrificial layer 12 and an etch stop layer 14 through discrete conductive elements 32, as described with respect to the previous embodiments. The resulting wafer level assembly 100' may then be scribed from above, and singulated semiconductor dice 30 or groups of semiconductor dice 30 with associated redistribution layers 15 are removed from support substrate 10 after etching of sacrificial layer 12. Underfilling with a dielectric material 34 may be effected, as desired, before or after singulation. As with the previous embodiments of the invention, wafer 200 may be thinned as depicted in broken line 202, either prior to or after being secured to support substrate 10 by the mechanical and electrical connections provided by discrete conductive elements 32.

Figure 12A:
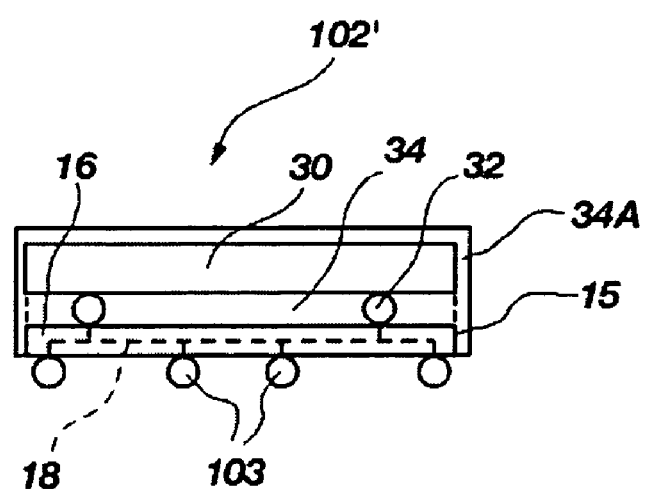

The resulting semiconductor component packages 102' (see FIG. 12A) may then be further processed, as by application of discrete conductive elements 103 and additional packaging material, such as a dielectric coating or encapsulant 34A, placed over the sides or back sides of the packages 102', or both, as shown. Note that underfilling may be effected concurrently with the back side and side encapsulation, if desired. In another approach, the wafer level assembly 100' may be scribed from below, the unsingulated redistribution layer 15 removed from support substrate 10, all of the dice conductively bumped at the wafer level, and then semiconductor component packages 102' singulated or removed in groups and further processed, as desired or required.

It will be apparent that details of the processes, methods and structures herein described can be varied considerably without departing from the concept and scope of the invention. The claims alone define the scope of the invention as conceived and as described herein.

What is claimed is:

1. A method for fabricating a semiconductor component package including a redistribution layer, the method comprising:

providing a support substrate;

depositing a layer of sacrificial material on the support substrate;

depositing an etch stop layer on the layer of sacrificial material;

forming at least a first level of conductive redistribution lines disposed in a dielectric material on the etch stop layer; and mechanically and electrically connecting a plurality of semiconductor dice to lines of the at least a first level of conductive redistribution lines.

2. The method of claim 1, further comprising:

scribing between semiconductor dice of the plurality to expose portions of the layer of sacrificial material; and etching the layer of sacrificial material through the exposed portions thereof enable removal of the support substrate.

3. The method of claim 1, wherein providing a support substrate comprises providing a substrate of silicon, BT resin, FR-4 laminate, FR-5 laminate, ceramic, a metal material or a polymeric material.

4. The method of claim 1, wherein depositing a layer of sacrificial material on the support substrate comprises depositing a silicon oxide, aluminum borophosphosilicate glass (BPSG) or TEOS on the support substrate.

5. The method of claim 1, wherein depositing an etch stop layer on the layer of sacrificial material comprises depositing a layer of material exhibiting a significantly slower etch rate to a selected etchant than the layer of sacrificial material.

6. The method of claim 1, wherein depositing an etch stop layer comprises depositing TEOS or a polymeric material.

7. The method of claim 1, wherein forming at least a first level of conductive redistribution lines on the etch stop layer comprises depositing a dielectric material on the etch stop layer, forming recesses in the dielectric material and filling the recesses with a conductive material to form conductive traces, and depositing a dielectric material over the conductive traces.

8. The method of claim 1, wherein forming at least a first level of conductive redistribution lines on the etch stop layer comprises depositing a dielectric material on the etch stop layer, forming conductive traces on the dielectric material and depositing a dielectric material around and over the conductive traces.

9. The method of claim 1, wherein forming at least a first level of conductive redistribution lines comprises forming metallic traces from at least one of aluminum, copper, nickel, gold, and alloys thereof.

10. The method of claim 1, further comprising forming terminal pads adjacent the etch stop layer in contact with the at least a first level of conductive redistribution lines.

11. The method of claim 1, further comprising forming terminal pads exposed through an upper surface of the dielectric material in contact with the at least a first level of conductive redistribution lines.

12. The method of claim 2, wherein scribing is effected through the dielectric material and redistribution layer and the etch stop layer to the layer of sacrificial material.

13. The method of claim 12, further comprising removing at least portions of the etch stop layer to provide electrical contact locations to lines of the at least a first level of conductive redistribution lines.

14. The method of claim 13, wherein removing at least portions of the etch stop layer is effected with a plasma.

15. The method of claim 13, further comprising providing discrete conductive elements to the electrical contact locations.

16. The method of claim 2, wherein scribing is effected through the support substrate to the layer of sacrificial material.

17. The method of claim 16, further comprising removing at least portions of the etch stop layer to provide electrical contact locations to lines of the at least a first level of conductive redistribution lines.

18. The method of claim 16, wherein removing at least portions of the etch stop layer is effected with a plasma.

19. The method of claim 17, further comprising providing discrete conductive elements to the electrical contact locations.

20. The method of claim 19, wherein providing discrete conductive elements is conducted at a wafer level.

21. The method of claim 1, further comprising characterizing the semiconductor dice of the plurality as known good dice prior to mechanically and electrically connecting the plurality of semiconductor dice to the lines of the at least a first level of conductive redistribution lines.

22. The method of claim 1, further comprising configuring the plurality of semiconductor dice for flip-chip mechanical and electrical connection to the lines of the at least a first level of conductive redistribution lines, connecting the plurality of semiconductor dice in a flip-chip configuration and further comprising disposing a dielectric underfill material between semiconductor dice of the plurality and the dielectric material.

23. The method of claim 1, further comprising encapsulating sides and back sides of the semiconductor dice of the plurality in a dielectric material.

24. The method of claim 1, further comprising thinning the semiconductor dice of the plurality from back sides thereof.

25. The method of claim 24, wherein thinning is effected prior to mechanically and electrically connecting the plurality of semiconductor dice.

26. The method of claim 24, further comprising configuring the plurality of semiconductor dice for flip-chip mechanical and electrical connection to the lines of the at least a first level of conductive redistribution lines, connecting the plurality of semiconductor dice in a flip-chip configuration, and thinning the semiconductor dice of the plurality thereafter.

27. The method of claim 1, further comprising providing the plurality of semiconductor dice in the form of a wafer bearing the plurality of semiconductor dice in unsingulated form.

28. The method of claim 27, further comprising:
scribing between semiconductor dice of the plurality to expose portions of the layer of sacrificial material; and
etching the layer of sacrificial material through the exposed portions thereof to enable removal of the support substrate.

29. The method of claim 28, wherein scribing is effected through the wafer, the dielectric material and redistribution layer and the etch stop layer to the sacrificial layer.

30. The method of claim 29, further comprising removing at least portions of the etch stop layer to provide electrical contact locations to lines of the at least a first level of conductive redistribution lines.

31. The method of claim 30, wherein removing at least portions of the etch stop layer is effected with a plasma.

32. The method of claim 30, further comprising providing discrete conductive elements to the electrical contact locations.

33. The method of claim 27, further comprising configuring the plurality of semiconductor dice for flip-chip mechanical and electrical connection to the lines of the at least a first level of conductive redistribution lines, connecting the plurality of semiconductor dice in a flip-chip configuration and further comprising disposing a dielectric underfill material between semiconductor dice of the plurality and the dielectric material.

34. The method of claim 27, further comprising encapsulating sides and back sides of the semiconductor dice of the plurality in a dielectric material.

35. The method of claim 28, wherein scribing is effected through the support substrate to the layer of sacrificial material.

36. The method of claim 35, further comprising removing at least portions of the etch stop layer to provide electrical contact locations to lines of the at least a first level of conductive redistribution lines.

37. The method of claim 36, wherein removing at least portions of the etch stop layer is effected with a plasma.

38. The method of claim 36, further comprising providing discrete conductive elements to the electrical contact locations.

39. The method of claim 38, wherein providing discrete conductive elements is conducted at a wafer level.

40. The method of claim 35, further comprising cutting the wafer and the dielectric material having the at least a first level of conductive redistribution lines disposed therein between semiconductor dice of the plurality to form semiconductor component packages.

41. The method of claim 27, further comprising thinning the wafer from the back side.

42. The method of claim 41, wherein thinning the wafer from the back side is effected after the semiconductor dice are mechanically and electrically connected.

43. The method of claim 1, further comprising providing the dielectric material as at least one of BCB, a polyimide, TEOS, silicon nitride, a photosensitive dielectric, phosphosilicate glass (PSG), borosilicate glass (BSG), and borophosphosilicate glass (BPSG).

* * * * *